(12) United States Patent
Tomura et al.

(10) Patent No.: US 8,288,996 B2
(45) Date of Patent: Oct. 16, 2012

(54) APPARATUS FOR ESTIMATING STATE OF CHARGE OF RECHARGEABLE BATTERY CHARGED BY VEHICLE-MOUNTED POWER GENERATION APPARATUS

(75) Inventors: Masayuki Tomura, Oobu (JP); Hiroaki Ono, Tokoname (JP)

(73) Assignee: Denso Corporation, Kariya (JP)

( * ) Notice: Subject to any disclaimer, the term of this patent is extended or adjusted under 35 U.S.C. 154(b) by 850 days.

(21) Appl. No.: 12/168,424

(22) Filed: Jul. 7, 2008

(65) Prior Publication Data

US 2009/0033285 A1 Feb. 5, 2009

(30) Foreign Application Priority Data

Aug. 1, 2007 (JP) ................. 2007-201210

(51) Int. Cl.
*H02J 7/16* (2006.01)
*H02J 7/04* (2006.01)
(52) U.S. Cl. ......... 320/132; 320/134; 320/141; 320/160
(58) Field of Classification Search .................. 320/104, 320/134, 137, 132, 133, 135, 136, 124, 125, 320/141, 148, 149, 160, 163
See application file for complete search history.

(56) References Cited

U.S. PATENT DOCUMENTS

| | | | |
|---|---|---|---|
| 6,335,610 B1 | 1/2002 | Winstead | |
| 6,404,163 B1 * | 6/2002 | Kapsokavathis et al. | 320/104 |
| 7,053,588 B2 * | 5/2006 | Nakanishi et al. | 320/104 |
| 7,317,300 B2 * | 1/2008 | Sada et al. | 320/136 |
| 7,564,221 B2 * | 7/2009 | Asai et al. | 320/132 |
| 7,652,448 B2 * | 1/2010 | Palladino | 320/104 |
| 7,902,829 B2 * | 3/2011 | Tae et al. | 324/433 |
| 2004/0164616 A1 | 8/2004 | Obayashi et al. | |
| 2005/0269991 A1 * | 12/2005 | Mitsui et al. | 320/132 |
| 2006/0091862 A1 * | 5/2006 | Melichar | 320/132 |
| 2006/0176022 A1 * | 8/2006 | Namba | 320/130 |
| 2006/0276980 A1 * | 12/2006 | Mizuno et al. | 702/63 |
| 2008/0042615 A1 * | 2/2008 | Serrels et al. | 320/101 |

FOREIGN PATENT DOCUMENTS

| | | |
|---|---|---|
| JP | 2000-308274 | 11/2000 |
| JP | 2002-118905 | 4/2002 |
| JP | 2003-189498 | 7/2003 |
| JP | 2003-307557 | 10/2003 |
| JP | 2004-109007 | 4/2004 |
| JP | 2004-168126 | 6/2004 |
| JP | 2004-260908 | 9/2004 |
| JP | 2007-006591 | 1/2007 |

OTHER PUBLICATIONS

Japanese Office Action dated Aug. 4, 2009, issued in corresponding Japanese Application No. 2007-201210, with English translation.

* cited by examiner

*Primary Examiner* — Edward Tso
*Assistant Examiner* — Alexis Boateg
(74) *Attorney, Agent, or Firm* — Nixon & Vanderhye P.C.

(57) ABSTRACT

The apparatus is for estimating a state of charge of a rechargeable battery charged by a vehicle-mounted power generation apparatus capable of generating a variable output voltage. The estimating apparatus includes a detecting function of detecting a charging/discharging current of the rechargeable battery, and an estimating function of making an estimation of the state of charge on the basis of relationship data defining the relationship among the output voltage, the state of charge, and a convergence value to which the charging/discharging current converges through transient behavior thereof in a state where variation of the output voltage is below a predetermined value after the output voltage is changed.

20 Claims, 8 Drawing Sheets

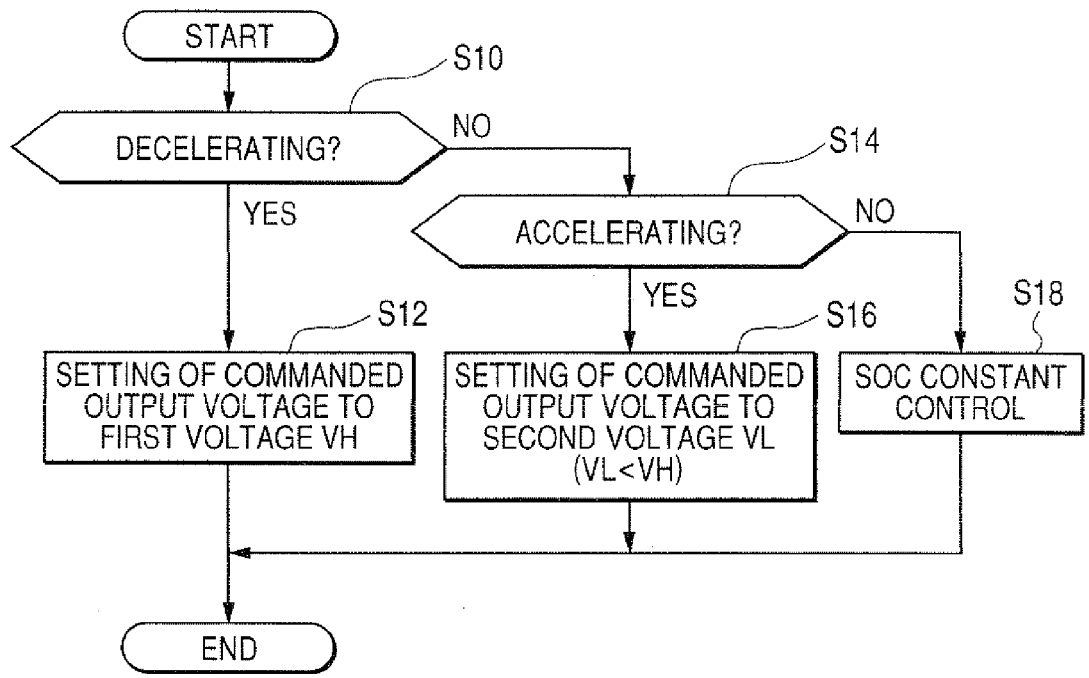
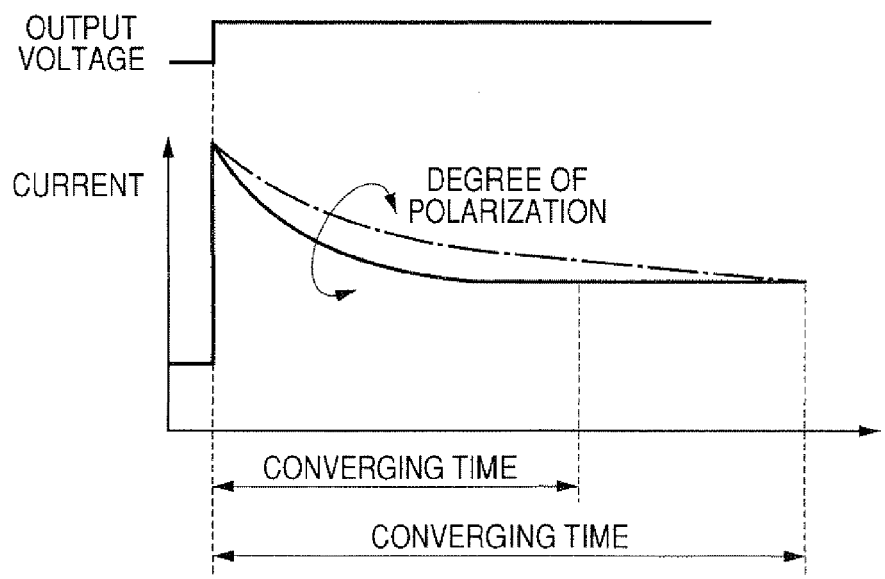

APPARATUS FOR ESTIMATING STATE OF CHARGE OF RECHARGEABLE BATTERY CHARGED BY VEHICLE-MOUNTED POWER GENERATION APPARATUS

CROSS-REFERENCE TO RELATED APPLICATION

This application is related to Japanese Patent Application No. 2007-201210 filed on Aug. 1, 2007, the contents of which are hereby incorporated by reference.

BACKGROUND OF THE INVENTION

1. Field of the Invention

The present invention relates to an apparatus for estimating the state of charge of a rechargeable battery charged by a vehicle-mounted generator which outputs a variable voltage.

2. Description of Related Art

As such an estimating apparatus, Japanese Patent Application Laid-open No. 2004-168126 discloses an apparatus configured to perform a process to periodically change the output voltage of an alternator driven by an internal combustion engine between a first voltage and a second voltage lower than the first voltage, and determine that a battery has reached a predetermined state of charge if the value of a charging current of the battery becomes a predetermined value after the output voltage of the alternator was set last time to the first voltage. Japanese Patent Application Laid-open No. 2003-307557 also discloses such an estimating apparatus.

Meanwhile, there has been proposed a control method in which the output voltage of an alternator is set larger when an increase amount of fuel consumption of an internal combustion engine needed for the alternator to generate power is smaller, with the object of reducing fuel consumption of the internal combustion engine. In performing such a control method, it is desired that, when the output voltage of an alternator is set to a small value to facilitate discharge of a battery, the battery is appropriately discharged within limits to maintain the reliability of the battery. To this end, it is required to estimate the state of charge of the battery with a high degree of accuracy.

However, there is a problem in using the conventional estimating apparatus as described above. That is, in case the state of charge of a battery is estimated by use of the estimating apparatus, and thereafter, the estimated state of the battery is updated in accordance with an integrated value of the charging/discharging current of the battery, since the accuracy of the estimated state of charge of the battery is low, the fuel consumption cannot be sufficiently reduced. It may occur that the estimating apparatus estimates the state of charge of the battery at shorter intervals. However, in this case, since the output voltage control of the alternator for the estimation purpose has to be performed more frequently, the output voltage control of the alternator for the purpose of reducing fuel consumption may be prevented from being performed.

SUMMARY OF THE INVENTION

The present invention provides an apparatus for estimating a state of charge of a rechargeable battery charged by a vehicle-mounted power generation apparatus capable of generating a variable output voltage, comprising:

a detecting function of detecting a charging/discharging current of the rechargeable battery; and an estimating function of making an estimation of the state of charge on the basis of relationship data defining relationship among the output voltage, the state of charge, and a convergence value into which the charging/discharging current converges through transient behavior thereof in a state where variation of the output voltage is below a predetermined value after the output voltage is changed.

The present invention also provides a charge control system including a vehicle-mounted power generation apparatus capable of generating a variable output voltage, and an apparatus for estimating a state of charge of a rechargeable battery charged by the vehicle-mounted power generation apparatus, the system comprising:

a detecting function of detecting a charging/discharging current of the rechargeable battery; and an estimating function of making an estimation of the state of charge on the basis of relationship data defining relationship among the output voltage, the state of charge, and a convergence value to which the charging/discharging current converges through transient behavior thereof in a state where variation of the output voltage is below a predetermined value after the output voltage is changed.

According to the present invention, it is possible to accurately estimate a state of charge of a rechargeable battery charged by a vehicle-mounted power generation apparatus capable of generating a variable output voltage.

Other advantages and features of the invention will become apparent from the following description including the drawings and claims.

BRIEF DESCRIPTION OF THE DRAWINGS

In the accompanying drawings:

FIG. 2 is a flowchart showing a process for controlling an output voltage of a power generation apparatus performed by an ECU included in the charge control system of the first embodiment;

FIG. 3 is a time chart showing a behavior of a charging current of a battery after the output voltage of the power generation apparatus is increased stepwise;

PREFERRED EMBODIMENTS OF THE INVENTION

First Embodiment

Figure 1:
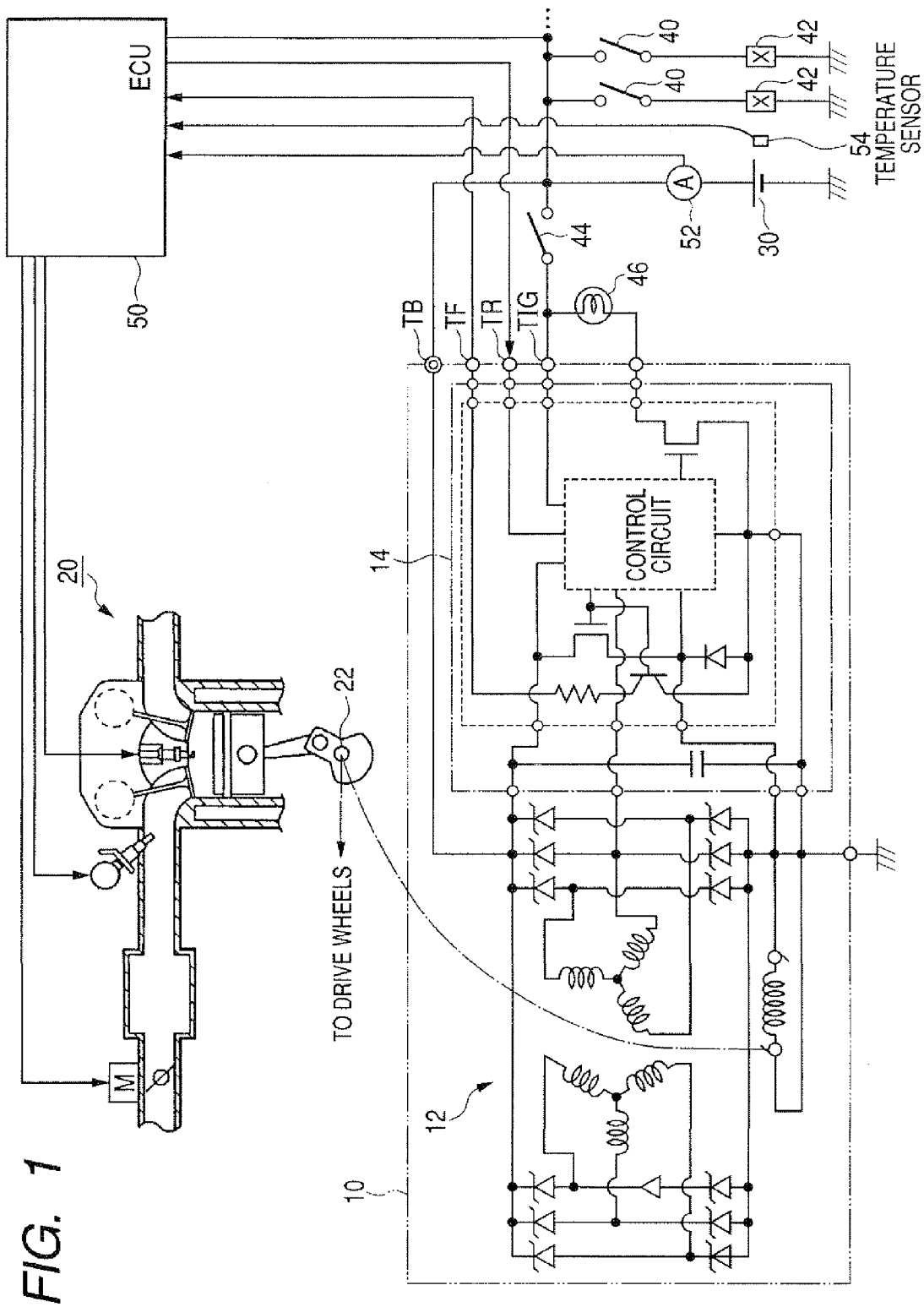
FIG. 1 is a diagram showing an overall structure of a charge control system including an apparatus for estimating a state of charge of a rechargeable battery of a first embodiment of the invention.

FIG. 1 is a diagram showing an overall structure of a charge control system including an apparatus for estimating a state of charge of a rechargeable battery according to a first embodiment of the invention.

In this system, a power generation apparatus 10 is constituted by an alternator 12 and a regulator 14 regulating the output of the alternator 12. The alternator 12 is mechanically coupled to a crankshaft 22 of an internal combustion engine (a gasoline engine in this embodiment) 20 at its rotor. The rotor is driven to rotate by the torque of the crankshaft 22.

The power generation apparatus 10 has a battery terminal TB to which a battery 30 (lead-acid battery in this embodiment) is connected. Electrical loads 42 are parallel-connected to the battery 30 through switches 40. A power supply line laid between the battery terminal TB and the battery 30 is connected to an ignition terminal TIG of the power generation apparatus 10 when an ignition switch 44 is turned on. Between the ignition switches 44 and the ignition terminal TIG, a charge lamp 46 is connected.

An electronic control unit (referred to as ECU hereinafter) 50 as an electrical load operates to control the internal combustion engine 20 and the power generation apparatus 10. For example, the ECU 50 controls the voltage of the battery terminal TB, that is, controls the output voltage of the power generation apparatus 10 on the basis of a detected value from a current sensor 52 detecting a current discharged from the battery 30 and a current charged to the battery 30, and a detected value from a temperature sensor 54 detecting the temperature of the battery 30. The ECU 50 outputs a command designating the value of the output voltage of the power generation apparatus 10 (referred to as "commanded output voltage" hereinafter) to a command terminal TR of the power generation apparatus 10. The regulator 14 regulates the output voltage of the power generation apparatus 10 at this commanded output voltage. The ECU 50 takes in a power generation state signal indicative of the power generation capacity of the power generation apparatus 10 through a monitor terminal TF of the power generation apparatus 10. The power generation capacity is measured by a duty ratio (the ratio of an on-time period to an on/off cycle period) of a switching device included in the regulator 14.

In this embodiment, the output voltage is controlled such that the increase amount of fuel consumption of the engine 20 needed for the power generation apparatus 10 to generate power is as small as possible within predetermined limits of the state of charge (referred to as the SOC hereinafter) of the battery 30. Here, the SOC, which is generally represented in terms of 5-hour rate capacity or 10-hour rate capacity, is quantified as a ratio of the present charge amount of the battery 30 to the full charge amount of the battery 30. It is known that the open-circuit voltage (referred to as the OCV hereinafter) of a rechargeable battery, that is, the output voltage of the rechargeable battery when its terminals are open, increases with the increase of the SOC thereof. In this embodiment, the OCV of the battery 30 is 12.8 V when the SOC is 100%, and 11.8 V when the SOC is 0%.

Next, the output voltage control process in this system is explained with reference to the flowchart shown in FIG. 2. FIG. 2 is a flowchart showing the process for setting the output voltage, which is performed periodically by the ECU 50 of this embodiment.

This process, which is performed periodically by the ECU 50, begins by determining at step S10 whether or not the vehicle on which the charge control system is mounted is in a decelerating state. When the vehicle is decelerating, since the drive wheels of the vehicle drive the crankshaft 22 to rotate, the energy for the alternator 12 to generate power is supplied from the side of the drive wheels, and accordingly the fuel consumption of the engine 20 is reduced, possibly to zero. The vehicle may be determined to be in the decelerating state if it is detected that the accelerator pedal of the vehicle is released, and the vehicle speed is lowering.

If the determination result at step S10 is affirmative, since it can be regarded that the increase amount of fuel consumption need for the alternator 12 to generate power is relatively small, the process proceeds to step S12. At step S12, the commanded output voltage designated to the power generation apparatus 10 is set at a first voltage VH to facilitate charging of the battery 30. In this embodiment, the first voltage VH is set to 14.7 V, for example, which is higher than the OCV (12.8 V, for example) of the battery 30 when the SOC is 100%.

On the other hand, if the determination result at step S10 is negative, since it can be judged that generating power by the alternator 12 does not provide particular advantage in terms of reduction of the fuel consumption, the process proceeds to step S14. At step S14, it is determined whether or not the vehicle is in an accelerating state in which required torque of the engine 20 is large. The vehicle maybe determined to be in the accelerating state if it is detected that the accelerator pedal is depressed more than a predetermined amount, and the vehicle speed is increasing.

If the determination result at step S14 is affirmative, the process proceeds to step S16 where the commanded output voltage is set to a second voltage VL lower than the first voltage VH, in order to facilitate discharge of the battery 30.

On the other hand, if the determination result at step S14 is negative, the process proceeds to step 18 where a control is performed to adjust the commanded output voltage in order that the SOC is kept at a constant value.

When any one of steps S12, S16, and S18 is completed, the process is terminated.

Setting the commanded output voltage as described above makes it possible that electric energy, which is generated when the vehicle is in a driving state where the increase amount of the fuel consumption of the engine 20 is small, is consumed when the vehicle is in other driving states. This makes it possible to reduce the fuel consumption of the engine. However, if the accuracy of the SOC referred to at step S18 is low, the effect of the reduction of the fuel consumption is lowered. For example, if the accuracy of the estimated SOC is low, the actual SOC may be controlled at a value larger than a target value at step S18, as a result of which the amount of the chargeable power at step S12 is reduced. This makes it difficult to sufficiently charge the battery 30 when the increase amount of the fuel consumption needed to generate electric power is small.

Accordingly, in this embodiment, the SOC is accurately estimated in the way described below. FIG. 3 is a time chart showing the behavior of the charging current of the battery 30 after the output voltage of the power generation apparatus 10 is increased stepwise. The inventors of this application have found that when the output voltage of the power generation apparatus 10 is increased stepwise, the charging current of the battery 30 increases sharply, and then gradually converges to a certain value determined by the output voltage and the SOC, as shown in FIG. 3. However, the behavior of the charging current during the period until it reaches the certain value is not uniquely determined only by the output voltage and the SOC, but varies depending on the state of the battery 30. It can be regarded that the state of the battery 30 is a polarization state of the battery 30 immediately before the output voltage of the power generation apparatus 10 is changed. The polarization here is a phenomenon that occurs due to concentration distribution of sulfate ions in the vicinity of the electrode of the battery 30. The polarization state is determined depending on the charging/discharging history of the battery 30.

Figure 4:
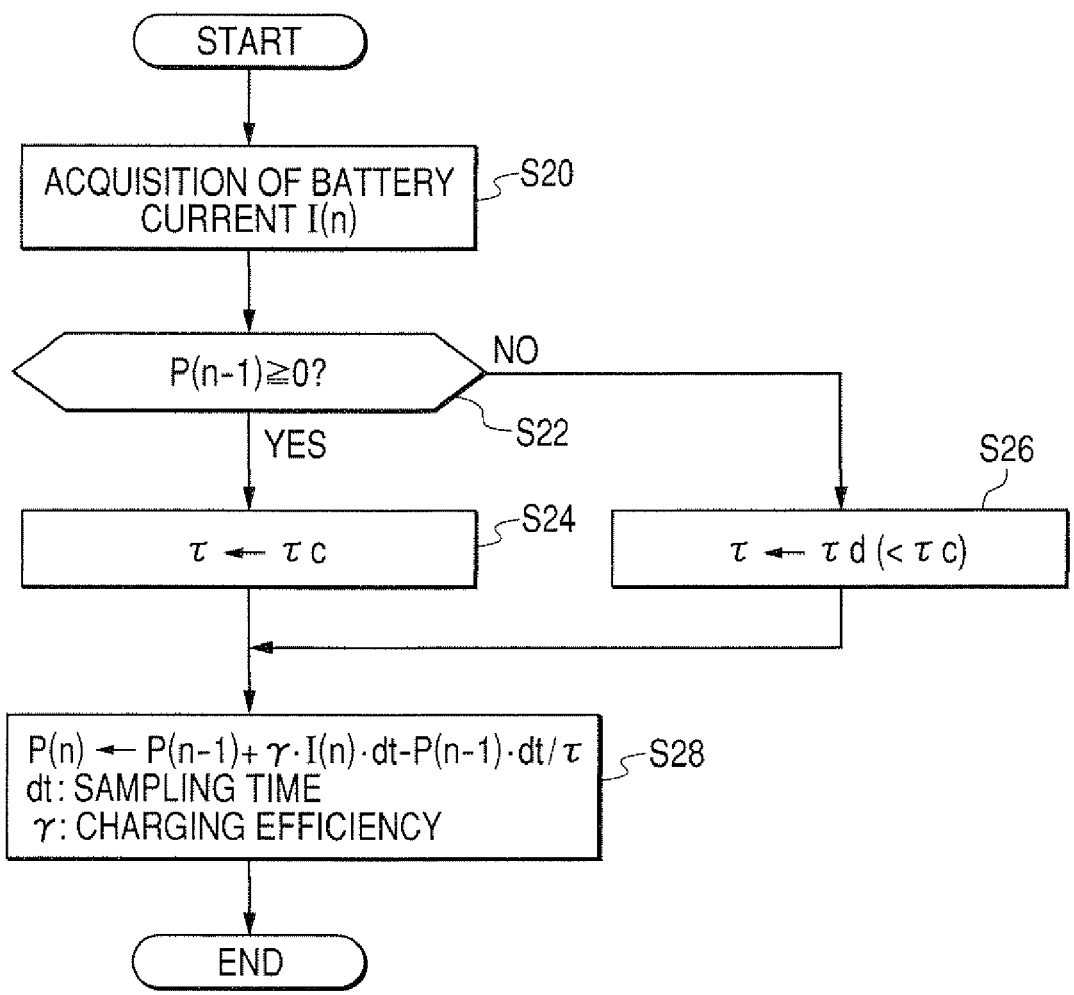
FIG. 4 is a flowchart showing a process for calculating a polarization correlation amount performed by the ECU included in the charge control system of the first embodiment.

In this embodiment, the polarization state is quantified as a polarization correlation amount P. In the following, the process to calculate the polarization correlation amount P is explained with reference to the flowchart shown in FIG. 4.

This process, which is performed periodically by the ECU 50, begins by obtaining the current I(n) of the battery 30 at step S20. Here, "n" is a parameter indicative of a sampling number. At step S22, it is determined whether or not the previously calculated polarization correlation amount P(n−1) is equal to or larger than zero in order to determine which of the effect of charging and the effect of discharging remains more strongly in the battery 30. The step S22 is provided for the reason that the rate at which the polarization state dissolves when the effect of charging remains more strongly than the effect of discharging in the battery 30 is different from that when the effect of discharging remains more strongly than the effect of charging in the battery 30.

If the determination result at step S22 is affirmative, since it can be determined that the effect of charging remains more strongly than the effect of discharging in the battery 30, the process proceeds to step S24 where a diffusion time constant τ is set to a charging time constant τc. On the other hand, if the determination result at step S22 is negative, since it can be determined that the effect of discharging remains more strongly than the effect of charging in the battery 30, the process proceeds to step S26 where the diffusion time constant τ is set to a discharging time constant τd smaller than the charging time constant τc, because the charging history is apt to dissolve easier than the discharging history.

When step S24 or step S26 is completed, the process proceeds to step S28 to calculate the polarization correlation amount P(n). Here, the polarization correlation amount P(n) is calculated by adding two terms to the previously calculated polarization correlation amount P(n−1). A first one of the two terms is "γ·I(n)·dt" which is for quantification of the charging/discharging history. In more detail, this term is for calculating a time-integrated value of "γ·I(n)" indicative of the value corresponding to the current I(n) of the battery 30 on the basis of the sampling time dt of this process and a charging efficiency γ. Since the current I(n) is positive when the battery 30 is being charged, and negative when the battery 30 is being discharged, it is possible to quantify the charging/discharging history. Although the charging efficiency γ is fixed in this embodiment, it may be altered depending on the sign of the current I(n).

A second one of the two terms is "−P(n−1)·dt/τ" which is for quantification of the attenuation effect of the polarization state (the sulfuric acid diffusion phenomenon in the vicinity of the electrode of the battery 30).

When step S28 is completed, this process is terminated.

Figure 5:
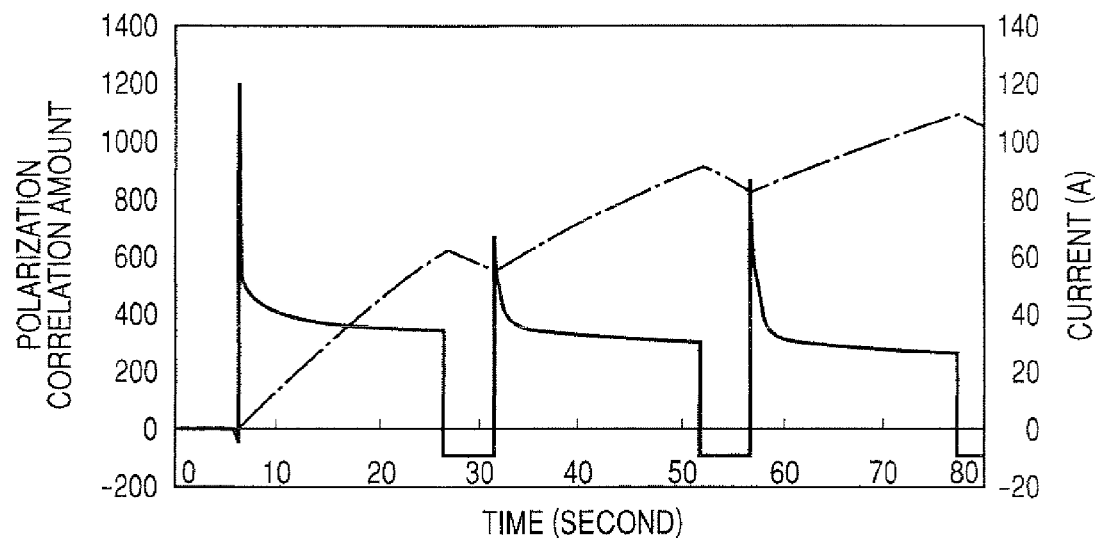
FIG. 5 is a time chart showing a relationship between the polarization correlation amount and the charging current of the battery in case the polarization correlation amount is positive.
Figure 6:
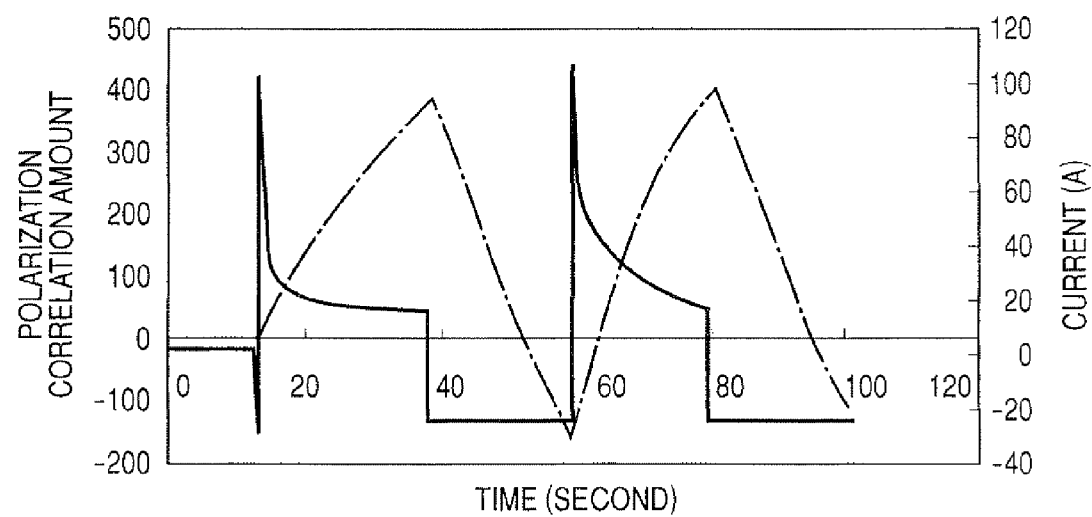
FIG. 6 is a time chart showing a relationship between the polarization correlation amount and the charging current of the battery in case the polarization correlation amount is negative.

FIG. 5 is a time chart showing a relationship between the polarization correlation amount P and the charging current of the battery 30 in case the correlation amount P is positive. As shown in FIG. 5, the behavior of the charging current due to the change of the output voltage varies depending on the polarization correlation amount P. FIG. 6 is a time chart showing a relationship between the polarization correlation amount P and the charging current of the battery 30 in case the polarization correlation amount P is negative. As shown in FIG. 6, also in this case, the behavior of the charging current due to the change of the output voltage varies depending on the polarization correlation amount P.

Accordingly, in this embodiment, the time required for the charging current to converge to a convergence value is calculated in accordance with the polarization correlation amount P, in order to estimate the SOC on the basis of the relationship between the SOC and the convergence value, which depends on the output voltage. Next, the process for estimating the SOC in accordance with the conversion value, which is performed periodically by the ECU 50, is explained with reference to the flowchart shown in FIG. 7.

In the following, firstly, the explanation is given for the case where the charging operation at step S12 in FIG. 2 continues until completion of the estimation of the SOC. Thereafter, the explanation is given for the case where the charging operation at step S12 in FIG. 2 terminates before completion of the estimation of the SOC.

<In Case the Charging Operation Continues Until Completion of the Estimation of the SOC>

Figure 8:
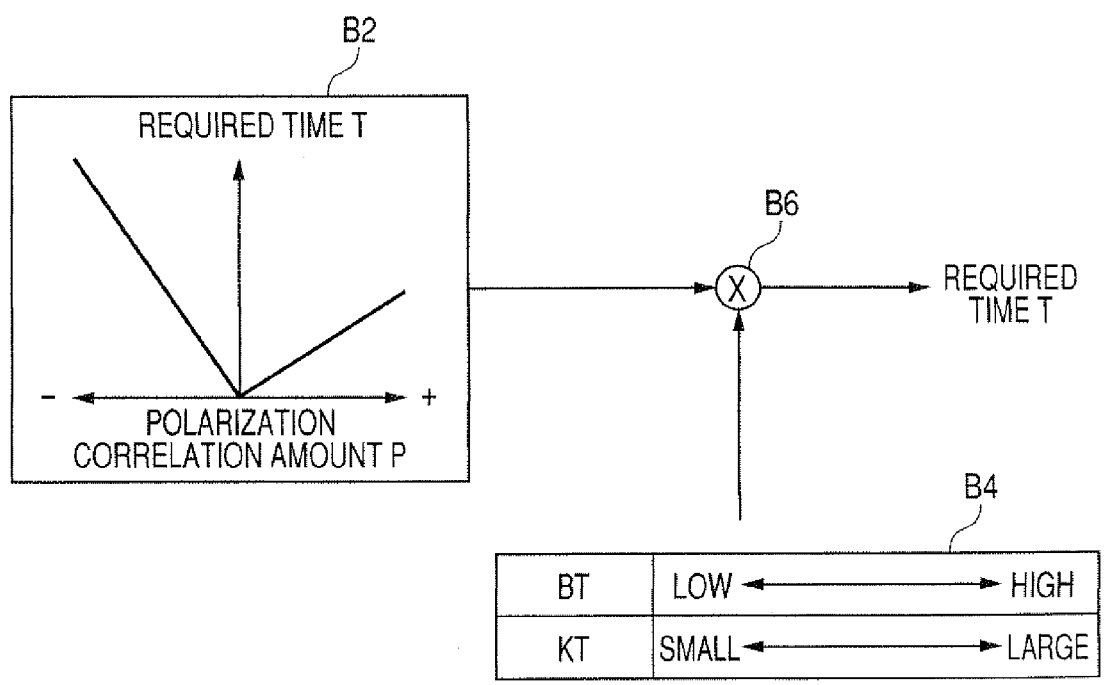
FIG. 8 is a diagram showing a configuration for calculating the time required for the battery current to converge after the output voltage of the power generation apparatus is increased stepwise in the first embodiment.

The estimation process begins by checking at step S40 whether or not a constant voltage charge flag Fc is "1" in order to determine whether or not the commanded output voltage is set to the first voltage VH to facilitate charging of the battery 30. If the check result at step S40 is negative, the process proceeds to step S42 where it is determined whether or not the commanded output voltage has just set to the first voltage VH in order to determine whether or not the commanded output voltage was not set to the first voltage VH in the process previously performed, and has only just set to the first voltage VH in the process presently performed. If the determination result at step S42 is affirmative, the process proceeds to step S44. At step S44, the constant voltage charge flag Fc is set to "1", and the required time T, i.e., the time required for the charging current to converge is calculated on the basis of the polarization correlation amount P and the temperature BT. FIG. 8 is a diagram showing a configuration implementing the operation at step S44. As shown in FIG. 8, this configuration includes a required-time base value calculating section B2, a temperature compensating section B4, and a required time calculating section B6.

The required-time base value calculating section B2 calculates a base value of the required time T on the basis of the polarization correlation amount P. Here, in the area where the polarization correlation amount P is positive, the required time T is set longer when the correlation amount P is larger. That is because, when the effect of charging remains more strongly, the time required for this effect to dissolve is longer. On the other hand, in the area where the polarization correlation amount P is negative, the required time T is set longer when the absolute value of the correlation amount P is larger. That is because, when the effect of discharging remains more strongly, the time required for this effect to dissolve is longer. As explained above, since the effect of discharging is harder to dissolve than the effect of charging, the required time T is set longer when the effect of discharging remains more strongly in the battery 30 than when the effect of charging remains more strongly in the battery 30.

The temperature compensating section B4 quantifies the temperature dependency of the required time T by use of a compensation coefficient KT. The compensation coefficient KT has a value which increases with the increase of the temperature BT. The required time calculating section B6 multiplies the base value of the required time T by the compensation coefficient KT to calculate the required time T having been temperature-compensated.

Figure 7:
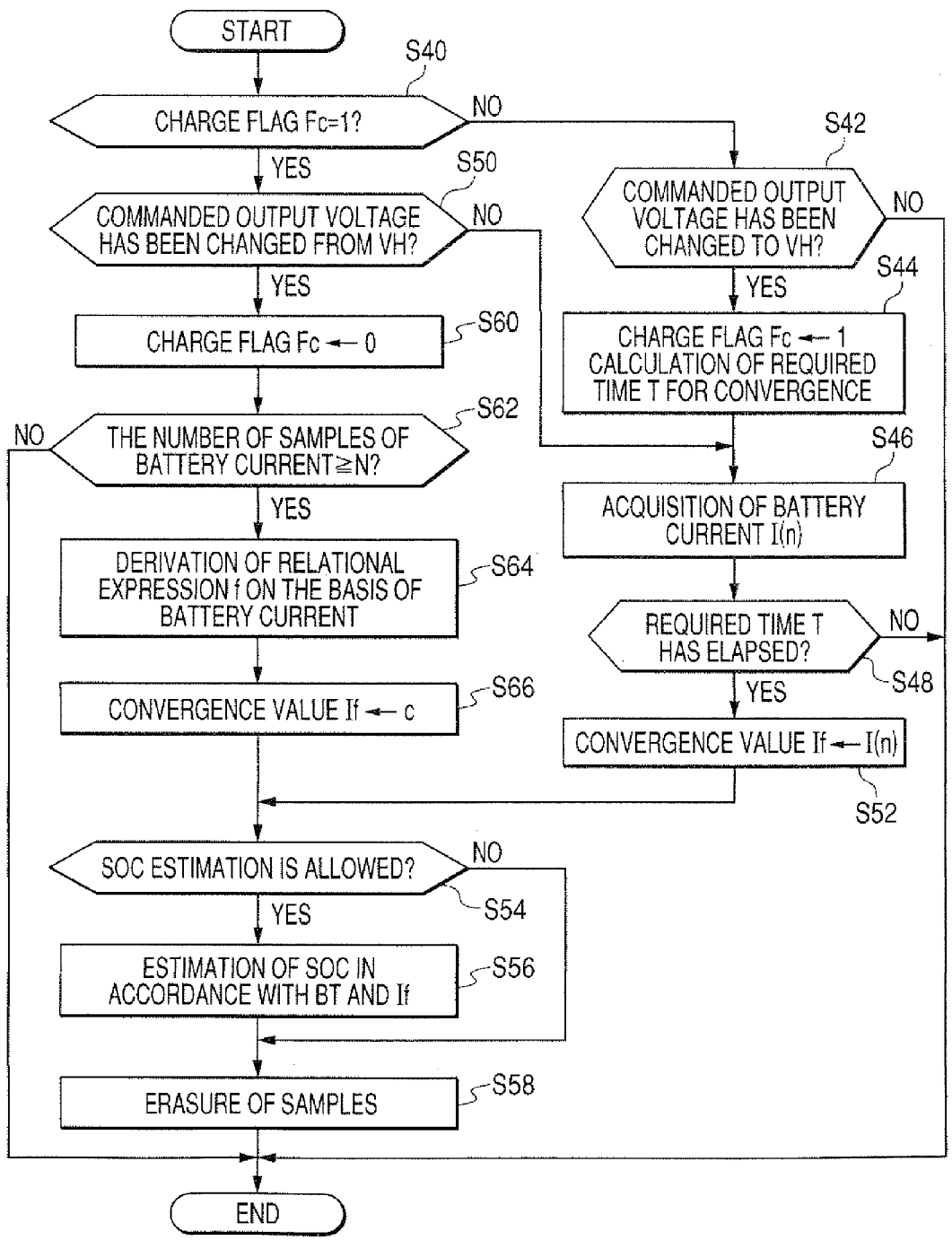
FIG. 7 is a flowchart showing a process for estimating the SOC of the battery performed by the ECU included in the charge control system of the first embodiment.

At step S46 in FIG. 7, the current I(n) of the battery 30 is obtained. At step S48, it is determined whether or not the required time T has elapsed. In the present process, since the commanded output voltage has been just changed to the first voltage VH, the determination result at step S48 becomes negative. When the negative determination is made at step S48, the process is terminated.

When this process starts next time, since the determination result at step S48 becomes positive, the process proceeds to step S50. In this case, at step S50, it is determined whether or not the commanded output voltage has been changed from the first value VH to other value in order to determine whether the charging operation of the battery 30, during which the output voltage is fixed to the first voltage VH, has been completed. If the determination result at step S50 is negative, the process proceeds to step S46. Steps S46 and S48 are repeated until the required time T elapses.

After elapse of the required time T, the convergence value If of the battery current is determined to be the present actual value of the current I(n) of the battery 30 at step S52. At step S54, it is determined whether or not it is allowed to perform the estimation of the SOC. That is, it is judged whether or not the SOC can be estimated correctly on the basis of the relationship between the convergence value and the SOC, which depends on the output voltage. In this embodiment, if both of the following conditions (A) and (B) are satisfied, it is determined that it is allowed to perform the estimation of the SOC.

(A) The amount of the current which the power generation apparatus 10 can supply to the battery 30 is above a predetermined level over the period during which the current I is sampled.

(B) The variation amount of the current I during the sampling period is below a predetermined value.

The condition (B) is prepared in view of the fact that when the variation of the current I is large, since the variation of the current consumption of the electrical loads 42 is large, the estimation error of the SOC may become unacceptably large.

The condition (A), which is for determining whether the current I can be the convergence value If, is prepared in view of the fact that when the suppliable charging current is smaller than the convergence value, it is not possible to estimate the SOC on the basis of the relationship between the convergence value and the SOC, which depends on the output voltage. The condition (A) may be any one of the following conditions (1) to (3).

(1) The power generation capacity of the power generation apparatus 10 is below a predetermined capacity. As explained above, the power generation capacity is defined by the duty ratio of the regulator. When the duty ratio is large, and accordingly the power generation capacity is large, since the current flowing into the electrical loads is large, the suppliable charging current of the battery 30 may not reach the convergence value.

(2) The power generation current of the power generation apparatus 10 is below a threshold value determined depending on the rotation speed thereof. The power generation capacity of the power generation apparatus 10 depends on the rotation speed. When the power generation current is excessively large with regard to the rotation speed, since the current flowing into the electrical loads is large, the suppliable charging current may not reach the convergence value.

(3) The current consumption of the electrical loads is below a predetermined value. When the current consumption of the electrical loads is excessively large, the suppliable charging current may not reach the convergence value.

If the determination result at step S54 is affirmative, the process proceeds to step S56 where the SOC is estimated on the basis of the temperature BT of the battery 30 and the convergence value If. The reason why the temperature BT of the battery 30 is used in estimating the SOC is that the convergence value If in accordance with the output voltage and the SOC varies depending on the temperature of the battery 30. In more detail, the convergence value If increases with the increase of the temperature, in this embodiment, the estimation of the SOC is performed while compensating for the temperature dependency of the relationship between the convergence value If and the SOC, to thereby accurately estimate the SOC regardless of the temperature BT of the battery 30. The SOC may be estimated by use of a two-dimensional map defining the relationship among the temperature BT, convergence value If and the SOC. Alternatively, the SOC calculated by use of a map defining the relationship between the convergence value If and the SOC may be corrected in accordance with the temperature BT.

When step S56 is completed, or the determination result at step S54 is negative, the process proceeds to step S58. At step S58, the sampling values of the current are erased.

<In Case the Charging Operation is Discontinued Before Completion of the Estimation of the SOC>

In this case, since the determination result at step S50 becomes affirmative, the process proceeds to step S60. At step S60, the constant voltage charge flag is set to "0". Subsequently, at step S62, it is determined whether or not the number of samples of the current of the battery 30 is equal to or larger than a predetermined number N in order to determine whether the convergence value can be estimated accurately from the samples. If the determination result at step S62 is affirmative, the process proceeds to step S64 where a relational expression f representing a temporal development of the charging current on the assumption that the period in which the commanded output voltage is set at the first voltage VH continues is derived, on the basis of the samples of the battery current I which have been taken during the period in which the commanded output voltage is set at the first voltage VH.

To be more exact, the relational expression f represents a temporal development of the charging current on the assumption that the SOC does not change if the period in which the commanded output voltage is set at the first voltage VH continues. The reason why the relational expression f can be derived from a plurality of the samples is that the variation rate of the charging current, which increases sharply when the commanded output voltage is set to the first voltage VH, and then gradually decreases, is very small after the convergence compared to that before the convergence. In more detail, after the convergence, since the charging current gradually decreases with moderate variation of the SOC, the absolute value of the variation rate of the charging current is very small compared to that before the convergence when the charging current exhibits a transient behavior. Hence, it is possible to derive the relational expression from the samples taken before the convergence, which shows the relationship between the time and the charging current on the assumption that the SOC does not vary if the period in which the commanded output voltage is set at the first voltage VH lasts for a long time.

This relational expression f shows that the decrease rate of the charging current decreases with time and converges to a certain value larger than 0. In this embodiment, the derivation of the relational expression f is performed to satisfy the condition that when the relational expression f is determined respectively for a plurality of different sample groups each including a plurality of the samples, the convergence values estimated by these determined relational expressions have the same value. That is because, as shown in FIG. 3, even for the same value of the SOC, the transient behavior of the charging current before the convergence is not uniquely determined due to the effect by the polarization etc. Accordingly, the relational expression f is required to enable estimating the convergence value at the same value irrespective of from which sample group the relational expression f is derived. This is possible if the relational expression f has more than two parameters. In this embodiment, as the relational expression f, an expression of "f=a·exp(−bt)+c" is used. The parameters a, b, c are determined from a plurality of the samples by use of the least square method, for example.

At subsequent step S66, the convergence value If is estimated in accordance with the relational expression f. Here, the constant term c (the intercept) is determined as the convergence value If. When step S66 is completed, the process proceeds to step S54.

Figure 9A:
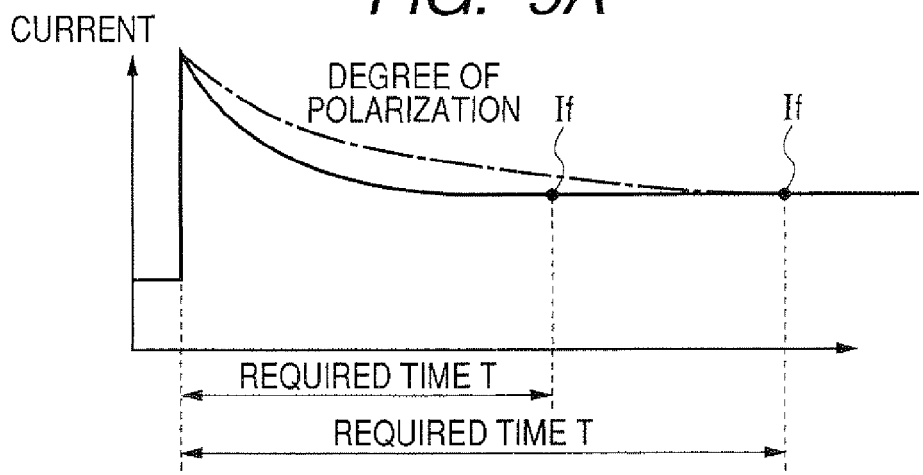
FIGS. 9A, 9B, 9C are time charts for explaining examples of estimating the SOC in the first embodiment.

In case the period in which the commanded output voltage is set at the first voltage VH is longer than the required time T which depends on the polarization state at the time, as shown in FIG. 9A, the SOC can be estimated from the value of the charging current at the time of the lapse of the required time T as the convergence value If, by the operation described above. Using the value of the charging current at the time of the lapse of the required time T makes it possible to keep the accuracy of estimating the SOC at high level for the following reason. The timing of the lapse of the required time T is a timing at which the effect by the polarization before the commanded output voltage is changed to the first voltage VH dissolves. That is, this timing is a timing at which the relationship between the charging current and the SOC becomes clearest. If the value of the charging current after the lapse of the required time T is used, the accuracy of estimating the SOC is lowered, because the SOC varies gradually, and in addition, the effect by the polarization due to continuation of the charging state of the battery 30 caused by setting the commanded output voltage to the first voltage VH becomes prominent.

Figure 9B:
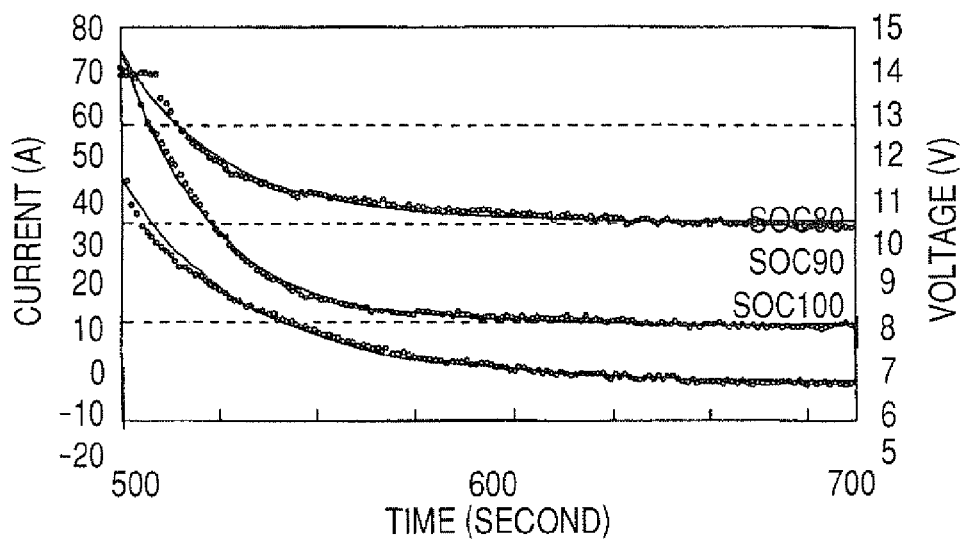

By setting the first voltage VH at a voltage sufficiently larger than the OCV of the battery 30 when the SOC is 100%, it becomes possible that the convergence value differs significantly depending on the value of the SOC as shown in FIG. 9B. This makes it possible to keep the accuracy of estimating the SOC at high level.

Figure 9C:
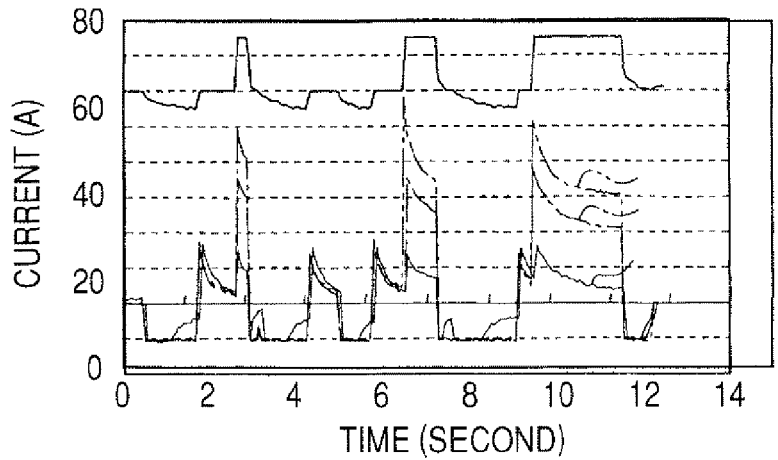

On the other hand, in case the period in which the commanded output voltage is set at the first voltage VH is shorter than the required time T, the convergence value If is estimated in accordance with the relative expression f represented by the solid line shown in FIG. 9C, and then the SOC is estimated on the basis of the estimated convergence value If. In FIG. 9C, the white circles indicate the values of the samples for each of three different values of the SOC. In each of these three cases, the relational expression f is derived from the samples of the charging current taken within 6 seconds from the time of changing the commanded output voltage. In the cases shown in FIG. 9C, actually, the current sampling operation is continued after the samples used to derive the relational expression f have been taken, in order to evaluate the accuracy of the estimation of the SOC in accordance with the relational expression f. As seen from FIG. 9C, in each of these three cases, the estimated charging current determined in accordance with the relational expression f is closely analogous to the actual charging current measured after the samples used to derive the relational expression f have been taken.

The above described embodiment of the invention provides the following advantages.

(1) The SOC is estimated on the basis of the output voltage of the power generation apparatus 10, and the relationship between the SOC and the convergence value of the charging current of the battery 30. This makes it possible to appropriately estimate the state of charge of the battery 30.

(2) The SOC is estimated by estimating the convergence value If by use of a plurality of detected values of the charging current after the commanded output voltage is set to the first voltage VH. The required time T, that is, the time required for the charging current to converge is of the order of 10 seconds. Accordingly, if the estimation of the SOC is performed only when the commanded output voltage is fixed for a period long enough for the charging current to converge, the frequency of performing the estimation of the SOC cannot be high enough. In this embodiment, since the convergence value is estimated by use of a plurality of detected values of the charging current, it is possible to obtain data regarding the convergence value even if the period in which the commanded output voltage is kept unchanged does not last until the charging current converges. This makes it possible that the frequency of performing the estimation of the SOC is kept high.

(3) The relational expression f which enables estimating the temporal variation of the charging current is derived on the basis of a plurality of detected values of the charging current, and then the convergence value is calculated in accordance with the derived relational expression f. This makes it possible to appropriately estimate the SOC on the basis of this calculated convergence value. This makes it possible to appropriately estimate the convergence value.

(4) When the SOC is estimated on the basis of the convergence value, the temperature of the battery is taken into account. This makes it possible to accurately estimate the SOC, because the temperature dependency of the relationship between the convergence value and the SOC can be compensated for.

(5) When the period in which the commanded output voltage is fixed at the first voltage VH is longer than the required time T, the SOC of the battery 30 is estimated on the basis of the detected value of the charging current. This makes it possible to estimate the SOC accurately as much as possible.

(6) The required time T is calculated on the basis of the polarization correlation amount P. This makes it possible to appropriately calculate the required time T.

(7) The estimation of the SOC is performed when the battery 30 is charged by the power generation apparatus 10. It is desirable that the output voltage significantly differs from the open-circuit voltage OCV of the battery 30, so that the convergence value depending on the output voltage clearly varies in accordance with the SOC. On the other hand, generally, there are strict restrictions in setting the commanded output voltage at a low voltage, compared to setting the commanded output voltage at a high voltage. In this regard, since the SOC is estimated when the battery 30 is charged, the frequency of performing the estimation of the SOC by use of the relationship between the convergence value and the SOC, which depends on the output voltage, can be kept high in this embodiment.

(8) The estimation of the SOC is performed when the amount of the current which the power generation apparatus 10 can supply to the battery 30 is above a predetermined value. This makes it possible to accurately estimate the SOC.

(9) The commanded output voltage is made variable depending on the increase amount of the fuel consumption of the engine necessary to generate electric power. Since there frequently occurs the case where the commanded output voltage is changed before the charging current converges, estimating the convergence value If in accordance with the relational expression f is particularly effective in this case.

(10) The commanded output voltage is set to the first voltage VH when the vehicle is decelerating to facilitate charging of the battery 30, and set depending on the SOC when the vehicle is in a normal running state. To set the commanded output voltage as above to reduce the fuel consumption, it is required to detect the SOC at every moment of time. According to this embodiment where the SOC can be estimated each time the commanded output voltage is set to the first voltage VH, it is possible to effectively reduce the fuel consumption, because the accuracy of the estimation of the SOC can be kept high.

Second Embodiment

Next, a second embodiment of the invention is described with the emphasis on the difference with the first embodiment.

In the second embodiment, the SOC is estimated when the output voltage of the power generation apparatus 10 is fixed, and the battery 30 is discharged.

Figure 10:
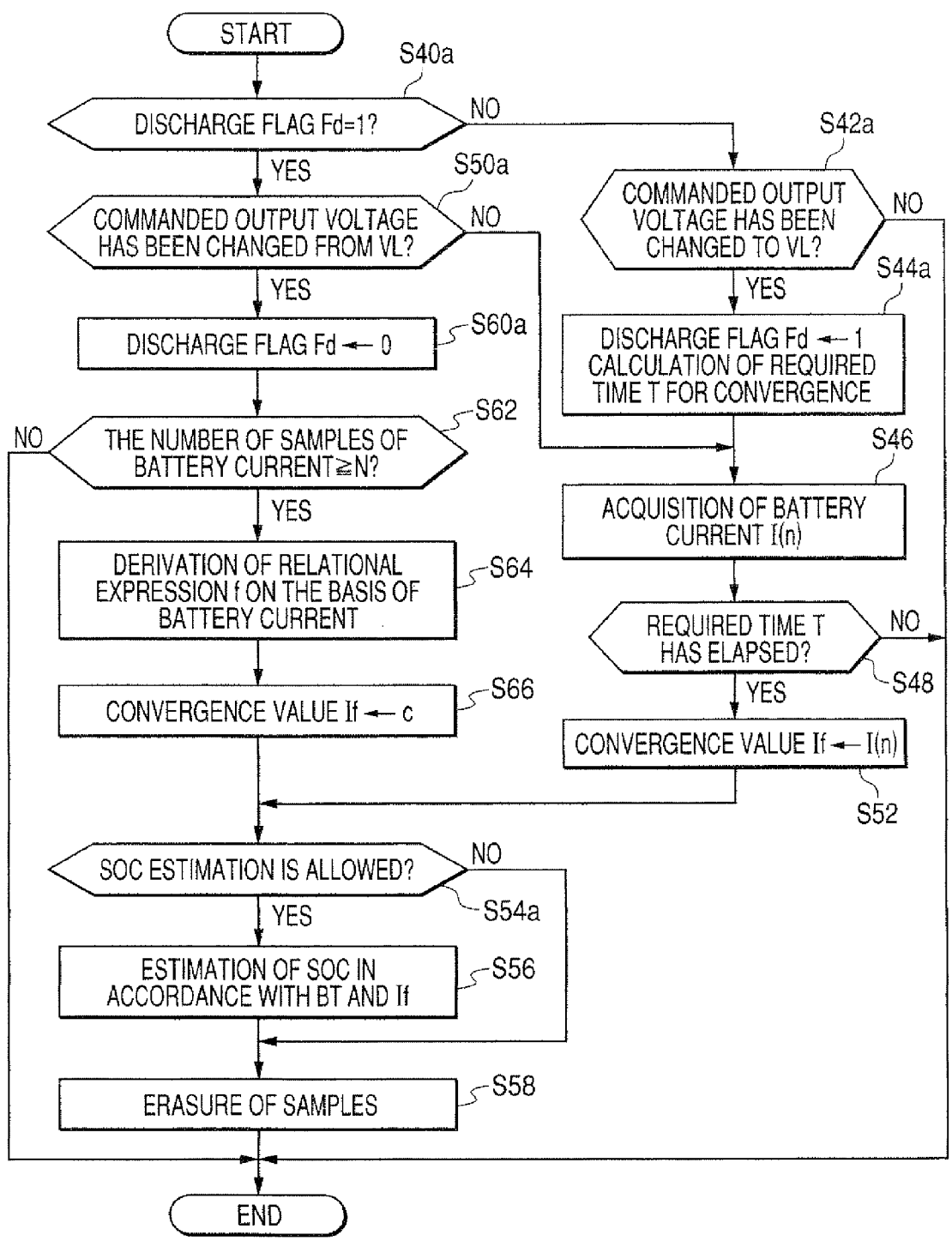
FIG. 10 is a flowchart showing a process for estimating the SOC of a battery performed by an ECU included in the charge control system of a second embodiment of the invention.

FIG. 10 is a flowchart showing a process for estimating the SOC which is performed periodically by the ECU 50 of this embodiment. In FIG. 10, the same step numbers respectively designate steps that are the same as or correspond to those shown in FIG. 7.

This step begins by determining, as step S40a, whether or not a constant voltage discharge flag Fd is at "1" to indicate that step S16 shown in FIG. 2 should be performed. If the determination result at step S40a is negative, the process proceeds to step S42a where it is determined whether or not the commanded output voltage has just been changed to the second voltage VL. If the determination result at step S42a is affirmative, the process proceeds to step S44a where an operation is performed which is the same as the operation at step S44 shown in FIG. 7 except that the constant voltage discharge flag Fd is set to "1" instead of the constant voltage charge flag Fc being set to "1". On the other hand, if the determination result at step S40a is affirmative, the process proceeds to step S50a where it is determined whether or not the commanded output voltage has been just changed from the second voltage VL to other voltage. If the determination result at step S50a is affirmative, the process proceeds to step S60a where the constant voltage discharge flag Fd is set to "0". At step S54a, it is determined whether or not the estimation of the SOC is allowed to be performed. In this process, when the above described conditions (B) and (C) are satisfied, the estimation of the SOC is allowed to be performed. The reason is that if the consumption current of the electrical loads 42 is excessively small, the convergence value of the discharging current of the battery 30 becomes independent of the output voltage and the SOC.

The second embodiment also provides the above described advantages (1) to (6), (9), and (10) provided by the first embodiment.

Other Embodiments

The above described embodiments may be modified as described below.

In the above embodiments, the convergence value is estimated on the basis of the relational expression only when the period during which the commanded output voltage is fixed is shorter than the required time T. However, the convergence value may be estimated on the basis of the relational expression irrespective of whether the period during which the commanded output voltage is fixed is longer or shorter than the required time T. In this case, it is desirable that means for evaluating the reliability of the estimated convergence value on the basis of the detected value of the battery current is provided. Such means may be configured to determine that the reliability of the estimated convergence value is low if the value of the battery current detected immediately before the commanded output voltage is changed is smaller by a predetermined value than the estimated value of the convergence value. This configuration makes it possible to inhibit estimating the SOC on the basis of the estimated convergence value the reliability of which has been evaluated to be low, or invalidate the estimated SOC.

The relational expression for estimating the charging current or the discharging current of the battery 30 is not limited to the one exemplified in the above embodiments. For example, it may be "$f=a/(t \cdot t)+b/t+c$", or "$f=a/t+b$", or "$f=1/(at+b)+c/t$".

The method of estimating the behavior of the charging or discharging current on the basis of a plurality of the values of the charging or discharging current detected before this estimation is not limited to the one that uses the relational expression. For example, the behavior of the charging or discharging current may be estimated by use of means for calculating the convergence value of the battery current on the basis of the difference between each temporarily adjacent two of three or more detected values, and the oldest one of the three or more detected values. This means may be implemented by a map defining a relationship among the difference between each temporarily adjacent two detected values, the oldest detected value, and the convergence value. Also, the behavior of the charging or discharging current may be estimated by use of means for estimating the convergence value by calculating the decrease rate of the detected values on the basis of the above difference, and calculating the decrease amount of the battery current at the time when the decrease rate becomes zero. Also such means has to satisfy the condition that the convergence values estimated respectively for a plurality of different sample groups each including a plurality of the samples have the same value.

The expression for calculating the polarization correlation amount P on the basis of the charging/discharging history is not limited to the one exemplified in the above embodiments. For example, the polarization correlation amount P may be calculated from an expression which is the same as the expression shown in step S28 in FIG. 4 from which the term "$-P(n-1) \cdot dt/\tau$" quantitatively representing sulfuric acid diffusion is deleted.

In the above embodiments, although the SOC is estimated on the basis of the value of the current of the battery 30, or the convergence value of the current of the battery 30 estimated in accordance with the relational expression, the method of estimating the SOC is not limited thereto. For example, the SOC may be estimated on the basis of the value of the current of the battery 30 detected when its variation becomes below a predetermined value.

The control for varying the output voltage in accordance with the increase amount of the fuel consumption necessary to generate electric power is not limited to the one described above. For example, in the process shown in FIG. 2, step S18 may be always performed if the determination result at step S10 is negative. For another example, as described in Japanese Patent Application Laid-open No. 2002-118905, or No. 2004-260908, the output voltage of a power generation apparatus may be controlled in accordance with the increase amount of the fuel consumption of the engine per unit generation power of the power generation apparatus. Also in this case, the SOC can be estimated in the ways described in the above embodiments, when the state in which the variation of the output voltage is below a predetermined level continues. In case the commanded output voltage is changed variously, it is preferable that the required time T is calculated in accordance with not only the polarization correlation amount P but also the commanded output voltage, because the required time T may vary depending on the commanded output voltage. In addition, since the convergence value If also may vary depending on the commanded output voltage, it is preferable to take into account the commanded output voltage at the time of estimating the SOC on the basis of the convergence value If.

The method of detecting the current of the battery 30 is not limited to the one that uses the detected value from the current sensor 52. For example, the current of the battery 30 may be detected from the consumption current of the electrical loads 42, and the output current of the power generation apparatus 10.

The battery 30 does not necessarily have to be a lead-acid battery. In case a battery the output current of which is affected greatly by the polarization state thereof is used as the battery 30, the calculation of the required time T, the estimation of the convergence value If by use of the relational expression f are particularly effective.

The internal combustion engine 20 is not limited to a spark ignition type engine such as a gasoline engine. For example, the engine 20 may be a compression ignition type engine such as a diesel engine.

Although the above embodiments are directed to the case where a rechargeable battery is mounted on a vehicle with a single internal combustion engine as a drive power source, the present invention is applicable to a rechargeable battery mounted on a hybrid vehicle.

The above explained preferred embodiments are exemplary of the invention of the present application which is described solely by the claims appended below. It should be understood that modifications of the preferred embodiments may be made as would occur to one of skill in the art.

What is claimed is:

1. An apparatus for estimating a state of charge of a rechargeable battery charged by a vehicle-mounted power generation apparatus capable of generating a variable output voltage, comprising a configuration to perform:
  a detecting function of detecting a charging/discharging current of said rechargeable battery; and
  an estimating function of making an estimation of said state of charge on the basis of relationship data defining relationship among said output voltage, said state of charge, a convergence value to which said charging/discharging current converges through transient behavior thereof depending on a polarization state of said rechargeable battery in a state where variation of said output voltage is below a predetermined value after said output voltage is changed, and a plurality of values of said charging/discharging current during said transient behavior detected by said detecting function using a characteristic of the rechargeable battery that the charging/discharging current transiently converges to the convergence value with dissolution of the polarization state due to change of the output voltage.

2. The apparatus according to claim 1, wherein said estimating function estimates said convergence value in accordance with said plurality of said values of said charging/discharging current, and makes said estimation on the basis of said estimated convergence value.

3. The apparatus according to claim 1, wherein said estimating function include a function of deriving a relational expression enabling to estimate variation with time of said charging/discharging current on the basis of said plurality of said values of said charging/discharging current, a function of calculating said convergence value in accordance with said derived relational expression, and a function of estimating said state of charge on the basis of said calculated convergence value and said relationship data.

4. The apparatus according to claim 1, wherein said estimating function takes into account a temperature of said rechargeable battery at the time of making said estimation.

5. The apparatus according to claim 1, wherein said estimating function is configured to make a determination whether said charging/discharging current has actually converged into said convergence value, and when said determination is affirmative, makes said estimation on the basis of a detected value of said charging/discharging current determined to have converged into said convergence value.

6. The apparatus according to claim 5, further comprising a quantifying function of quantifying charging/discharging history of said rechargeable battery, said estimating function calculating a time required for said charging/discharging current to reach said convergence value on the basis of said quantified charging/discharging history, and making said determination on the basis of said calculated time.

7. The apparatus according to claim 1, wherein said estimating function makes said estimation when said rechargeable battery is charged by said power generation apparatus.

8. The apparatus according to claim 1, wherein said rechargeable battery and said power generation apparatus are connected with an electrical load, and said estimating function makes said estimation when said rechargeable battery is discharged.

9. The apparatus according to claim 1, wherein said rechargeable battery and said power generation apparatus are connected with an electrical load, and said estimating function makes said estimation when said rechargeable battery is charged by said power generation apparatus in a state where a current which said power generation apparatus can supply to said rechargeable battery is greater than a predetermined current.

10. The apparatus according to claim 1, wherein said power generation apparatus is configured to be driven to rotate by an output shaft of a vehicle-mounted internal combustion engine, and said output voltage of said power generation apparatus is controlled in accordance with an increase amount of fuel consumption of said vehicle-mounted internal combustion engine needed for said power generation apparatus to generate electric power.

11. The apparatus according to claim 1, wherein said power generation apparatus is configured to be driven to rotate by an output shaft of a vehicle-mounted internal combustion engine, and said output voltage of said power generation apparatus is set to such a value as to facilitate charging of said rechargeable battery when an increase amount of fuel consumption of said vehicle-mounted internal combustion engine needed for said power generation apparatus to generate electric power is equal to or below a predetermined threshold, and set to a value depending on said state of charge when said increase amount is above said predetermined threshold.

12. A charge control system including a vehicle-mounted power generation apparatus capable of generating a variable output voltage, and an apparatus for estimating a state of charge of a rechargeable battery charged by said vehicle-mounted power generation apparatus, said system comprising a configuration to perform:
  a detecting function of detecting a charging/discharging current of said rechargeable battery; and
  an estimating function of making an estimation of said state of charge on the basis of relationship data defining relationship among said output voltage, said state of charge, a convergence value into which said charging/discharging current converges through transient behavior thereof depending on a polarization state of said rechargeable battery in a state where variation of said output voltage is below a predetermined value after said output voltage is changed, and a plurality of values of said charging/discharging current during said transient behavior detected by said detecting function using a characteristic of the rechargeable battery that the charging/discharging current transiently converges to the convergence value with dissolution of the polarization state due to change of the output voltage.

13. An apparatus for estimating a state of charge of a rechargeable battery charged by a vehicle-mounted power generation apparatus capable of generating a variable output voltage, comprising:
a detector configured to detect a charging/discharging current of said rechargeable battery; and
a controller configured to make an estimation of said state of charge on the basis of relationship data defining relationship among said output voltage, said state of charge, a convergence value to which said charging/discharging current converges through transient behavior thereof depending on a polarization state of said rechargeable battery in a state where variation of said output voltage is below a predetermined value after said output voltage is changed, and a plurality of values of said charging/discharging current during said transient behavior detected by said detector using a characteristic of the rechargeable battery that the charging/discharging current transiently converges to the convergence value with dissolution of the polarization state due to change of the output voltage.

14. The apparatus according to claim 13, wherein said controller estimates said convergence value in accordance with said plurality of said values of said charging/discharging current, and makes said estimation on the basis of said estimated convergence value.

15. The apparatus according to claim 13, wherein said controller is configured to derive a relational expression enabling to estimate variation with time of said charging/discharging current on the basis of said plurality of said values of said charging/discharging current, calculate said convergence value in accordance with said derived relational expression, and estimate said state of charge on the basis of said calculated convergence value and said relationship data.

16. The apparatus according to claim 13, wherein said controller takes into account a temperature of said rechargeable battery at the time of making said estimation.

17. The apparatus according to claim 13, wherein said controller is configured to make a determination whether said charging/discharging current has actually converged into said convergence value, and when said determination is affirmative, makes said estimation on the basis of a detected value of said charging/discharging current determined to have converged into said convergence value.

18. The apparatus according to claim 13, wherein said controller makes said estimation when said rechargeable battery is charged by said power generation apparatus.

19. The apparatus according to claim 13, wherein said rechargeable battery and said power generation apparatus are connected with an electrical load, and said controller makes said estimation when said rechargeable battery is discharged.

20. The apparatus according to claim 13, wherein said rechargeable battery and said power generation apparatus are connected with an electrical load, and said controller makes said estimation when said rechargeable batter is charged by said power generation apparatus in a state where a current which said power generation apparatus can supply to said rechargeable battery is greater than a predetermined current.

* * * * *